United States Patent [19]

Voss

[11] Patent Number: 5,093,705
[45] Date of Patent: Mar. 3, 1992

[54] THYRISTOR WITH REDUCED CENTRAL ZONE THICKNESS

[75] Inventor: Peter Voss, Munich, Fed. Rep. of Germany

[73] Assignee: Siemens Aktiengesellschaft, Berlin and Munich, Fed. Rep. of Germany

[21] Appl. No.: 622,292

[22] Filed: Dec. 4, 1990

Related U.S. Application Data

[63] Continuation of Ser. No. 878,941, Jun. 26, 1986, abandoned.

[30] Foreign Application Priority Data

Jun. 28, 1985 [DE] Fed. Rep. of Germany ....... 3523236

[51] Int. Cl.$^5$ .................. H01L 29/74; H01L 29/747; H01L 27/02; H01L 29/10
[52] U.S. Cl. .......................... 357/38; 357/39; 357/43; 357/23.4
[58] Field of Search ............... 357/38, 39, 23.4, 43

[56] References Cited

U.S. PATENT DOCUMENTS

| | | | |
|---|---|---|---|
| 3,638,042 | 1/1972 | Studtmann | 357/38 |
| 3,900,771 | 8/1975 | Krause | 357/38 |
| 3,914,780 | 10/1975 | Marek | 357/38 |
| 3,967,308 | 6/1976 | Yatsuo et al. | 357/38 |
| 4,037,245 | 7/1977 | Ferro | 357/38 |
| 4,054,893 | 10/1977 | Hutson | 357/38 |
| 4,137,545 | 1/1979 | Becke | 357/15 |
| 4,223,328 | 9/1980 | Terasawa et al. | 357/22 |
| 4,331,884 | 5/1982 | Svedberg | 307/633 |
| 4,509,089 | 4/1985 | Svedberg | 357/38 |
| 4,546,401 | 10/1985 | Svedberg | 307/633 |
| 4,611,235 | 9/1986 | Bhagat | 357/38 |
| 4,626,703 | 12/1986 | Patalong et al. | 307/252 |
| 4,635,086 | 1/1987 | Miwa et al. | 357/43 |
| 4,975,755 | 12/1990 | Nishizawa | 357/38 |

FOREIGN PATENT DOCUMENTS

| | | | |
|---|---|---|---|
| 0017980 | 4/1980 | European Pat. Off. . | |
| 0028797 | 5/1981 | European Pat. Off. | 357/38 T |
| 0103181 | 8/1983 | European Pat. Off. . | |
| 0164292 | 12/1985 | European Pat. Off. . | |
| 2932043 | 3/1980 | Fed. Rep. of Germany | 357/38 T |
| 3226613 | 1/1984 | Fed. Rep. of Germany | 357/38 T |
| 2802843 | 8/1987 | Fed. Rep. of Germany . | |
| 52-2287 | 1/1977 | Japan | 357/38 G |
| 0005259 | 1/1977 | Japan | 357/38 G |
| 52-50176 | 4/1977 | Japan | 357/38 T |
| 54-22179 | 2/1979 | Japan | 357/38 T |
| 55-128870 | 10/1980 | Japan . | |
| 0081978 | 7/1981 | Japan | 357/38 G |
| 0112753 | 9/1981 | Japan | 357/38 G |
| 57-4100 | 1/1982 | Japan . | |
| 0217365 | 5/1983 | Japan | 357/38 |
| 58-151061 | 9/1983 | Japan . | |
| 59-217365 | 12/1984 | Japan . | |
| 1586171 | 3/1981 | United Kingdom . | |

OTHER PUBLICATIONS

H. Assalit et al., "Descr. of Tech. for Red. Thry. Turn-Off Time", IEEE Trans. on Elec. Dev., vol. ED-21 #7, Jul. 1974, pp. 416–420.

"Insulated-Gate Planar Thyristors: I-Structure and Basic Operation", by Plummer et al., IEEE Trans. on Electron Devices, vol. ED-27, No. 2, Feb. 1980, pp. 380–387.

Primary Examiner—Rolf Hille
Assistant Examiner—Wael Fahmy
Attorney, Agent, or Firm—Jeffrey P. Morris

[57] ABSTRACT

To avoid punch-through breakdown in conventional thyristors in off-state condition, the central zone (1) must be made so thick that at nominal off-state voltage a sufficient distance remains between the space charge region and the opposite pn junction. Contact regions are provided in the invention for drawing off the charge carriers produced during an off-state load condition. These contacts are disposed on the anode and cathode side at the central zone in the vicinity of the anode-side emitter zone (2) and the cathode-side base zone (3). As a result, the space charge region is allowed to be moved closer to the pn junction without the occurrence of a punch-through breakdown.

14 Claims, 4 Drawing Sheets

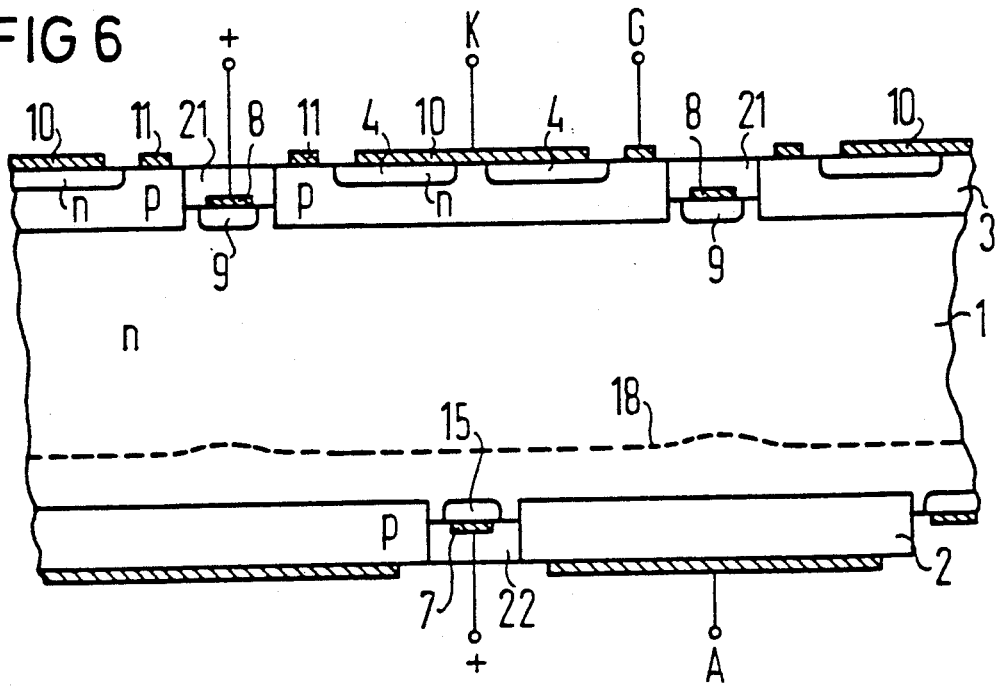
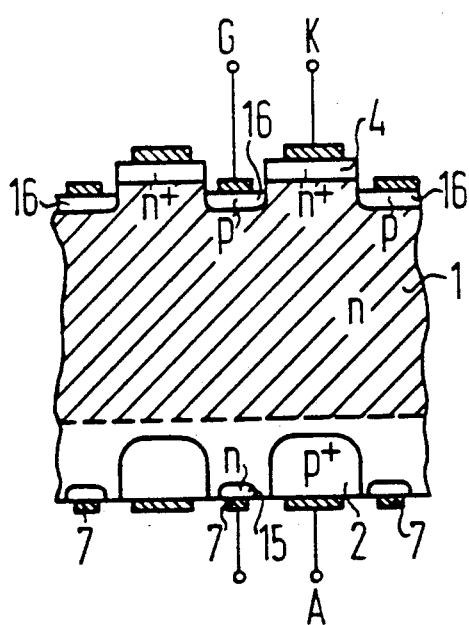
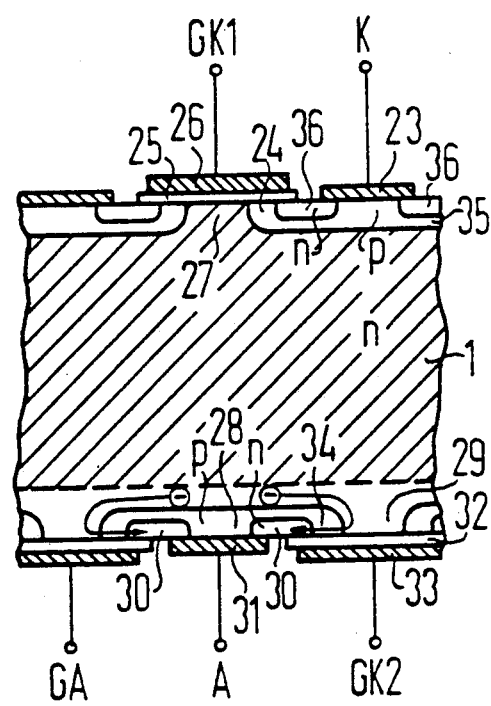

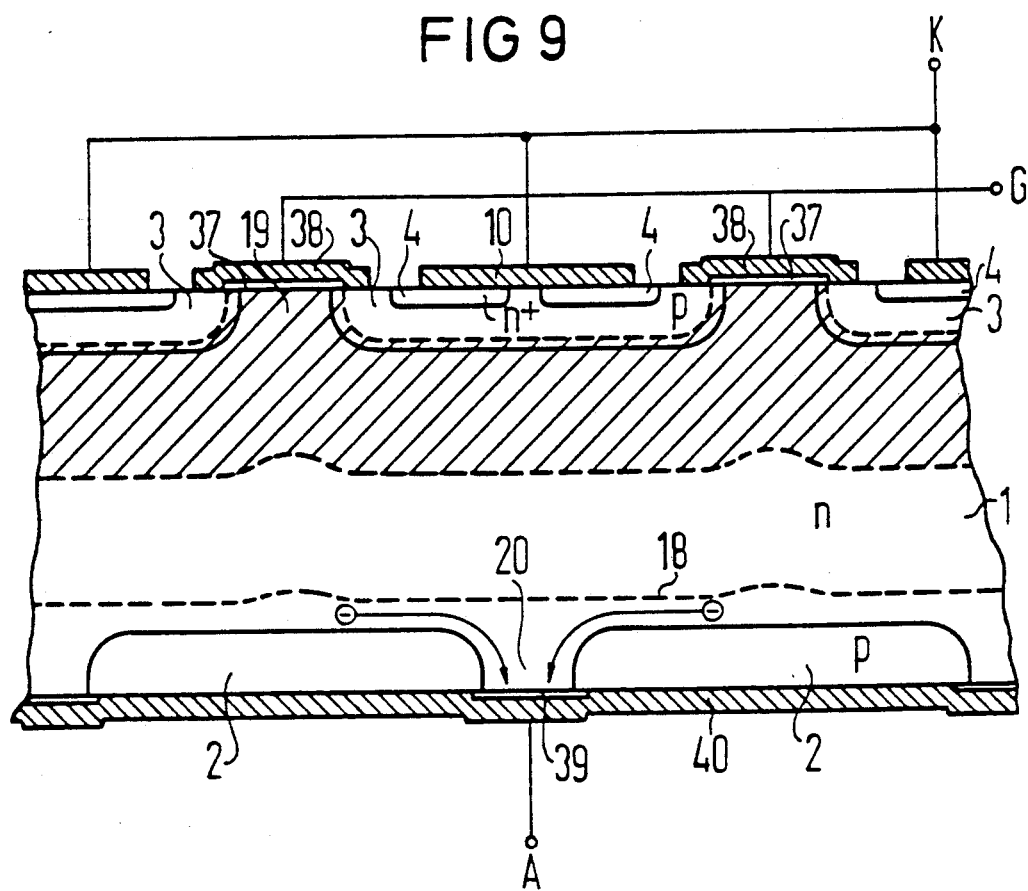

THYRISTOR WITH REDUCED CENTRAL ZONE THICKNESS

CROSS-REFERENCE TO RELATED APPLICATION

This is a continuation of Ser. No. 06/878,941 filed June 26, 1986, now abandoned.

BACKGROUND OF THE INVENTION

This invention relates to thyristors, and it relates, more particularly, to thyristors in a semiconductor body having a central zone of the first conductivity type and a predetermined doping level, at least one cathode-side base zone and at least one anode-side emitter zone of the second conductivity type, as well as at least one cathode electrode and one anode electrode.

Thyristors of this general type are widely known and used. Essential parameters of such thyristors are the maximum off-state voltage that can be withstood in the forward direction and in the reverse direction. This off-state voltage value is primarily a function of the doping and of the thickness of the central zone of the thyristor. However, the thickness of the central zone cannot be fully utilized. If, starting from the pn junction biased in blocking or reverse direction, the space charge region approaches the opposite pn junction, this produces an increase of the off-state current that is due to the fact that charge carrier pairs generated in the vicinity of the pn junction biased in the forward direction or reverse direction, respectively, act as control current for the pnp transistor structural portion of the thyristor.

In FIG. 1, a cross-sectional view of the semiconductor body of a typical conventional thyristor is illustrated schematically. The thyristor includes a central zone 1, an anode-side emitter zone 2, a cathode-side base zone 3, and a cathode-side emitter zone 4. If the off-state voltage in the breakover direction is present at the thyristor, the space charge region (shown hatched) expands from the pn junction between zones 1 and 3 in the direction of the pn junction between zones 1 and 2. In this case, the pn junction between zones 1 and 2 acts as an emitter for the pnp transistor type structure consisting of the zones 3, 1, 2. Negative charge carriers move out of zone 1 to zone 2, positive charge carriers out of zone 2 into zone 1. As the space charge region approaches the pn junction between zones 1 and 2, the greater will be the increase in off-state current, which is also intensified by transistor effect. The limit of blocking ability is reached when this current increases into steep rise.

When an off-state voltage is applied in the other direction (reverse direction), the pn junction between zones 1 and 2 is biased in the blocking direction. Then the pn junction between zones 1 and 3 is biased in forward direction and the space charge region must maintain a certain distance from this pn junction if punch through breakdown is to be avoided.

For this reason, the central zone must be made thicker than would be necessary for obtaining the desired breakdown voltage. Enlarging the width of the central zone, however, involves an increase of the on-state power losses and an increase of the carrier storage charge. The latter increases the recovery time and the reverse current integral.

SUMMARY OF THE INVENTION

It is an object of the present invention to develop a thyristor of the initially mentioned kind in such a way that the thickness of the central zone can be reduced compared to conventional thyristors with the same blocking voltage.

The invention takes the form of a thyristor having a semiconductor body including a central zone of a first conductivity type and a given doping level. At least one cathode-side base zone and at least one anode-side emitter zone of a second conductivity type are disposed in the body of the thyristor. The thyristor includes at least one cathode electrode and one anode electrode and at least one of the surfaces having the anode-side emitter zone or the cathode-side base zone. A portion of the central zone extends up to the surface of the semiconductor body between contact regions and is contacted separately. A positive potential source is connected to these contacts.

The geometrical configuration of the various zones are adapted to provide different patterns on the surface of the semiconductor body. One pattern provides a coherent net arrangement while another provides islands of metallized contacts. In addition, various illustrative embodiments of the invention provide different cross-sectional geometries of the zones in the thyristor. Particular versions of the thyristor take the form of a vertical junction field effect thyristor, of a vertical MOS field effect thyristor or an arrangement with pinch-off Schottky contacts.

BRIEF DESCRIPTION OF THE DRAWING

Features of the invention and additional objects of the invention will be more readily appreciated and better understood by reference to the following detailed description which should be considered in conjunction with the drawing.

The invention will be explained more specifically with reference to the illustrative embodiments described in connection with FIGS. 2 through 9.

Figure 2:
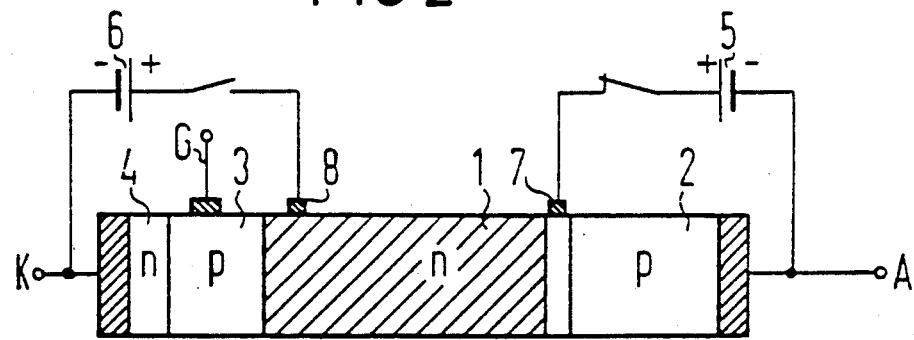

FIG. 2 depicts a rather theoretical representation of a thyristor in accordance with the principles of the invention involving contact regions associated with the central zone.

Figure 3:
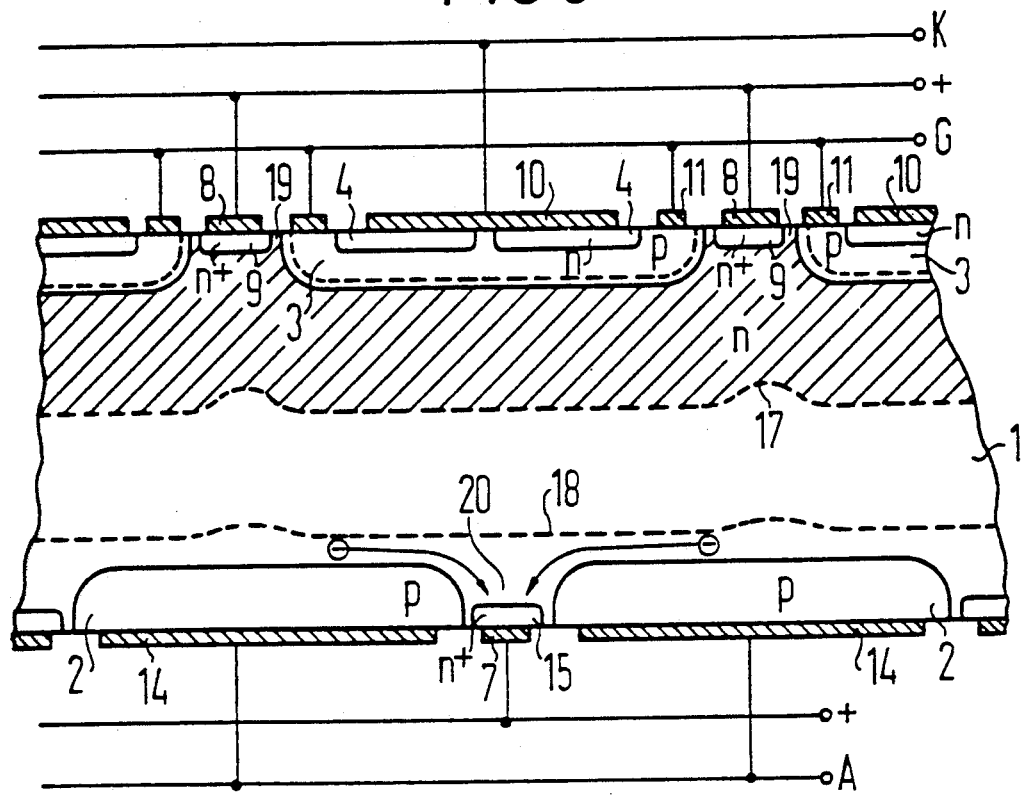

FIG. 3 is a cross-sectional view of a first illustrative embodiment of a thyristor.

Figure 4:
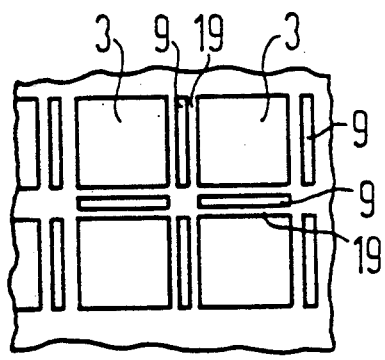
Figure 5:
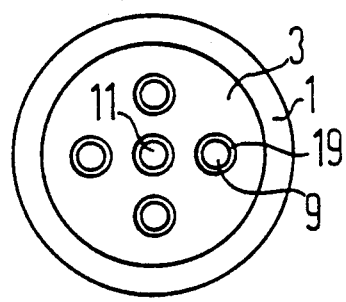

FIGS. 4 and 5 illustrate two possibilities of the geometrical configuration of the various zones of the semiconductor body at the planar substrate surface according to FIG. 3.

FIGS. 6 through 9 depict cross-sections of the semiconductor bodies of thyristors in accordance with the invention providing further illustrative embodiments.

DETAILED DESCRIPTION

Figure 1:
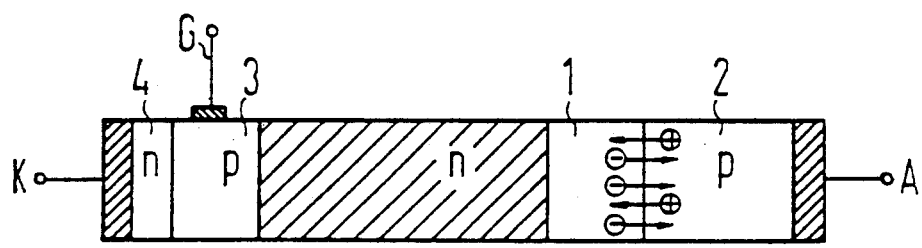
FIG. 1 is a schematic cross-sectional view of the semiconductor body of a typical conventional thyristor.

The semiconductor body of the thyristor according to FIG. 2 is designated with the same reference numerals for equivalent structural components as in FIG. 1. In the vicinity of the pn junctions between zones 1, 2 and zones 1, 3 respectively, there is additionally provided electrode 7 and electrode 8, which contact the central zone 1. The contacts 7, 8 are connected to current sources 5, 6. These current sources have their respective polarities poled so that electrons thermally produced within the space charge region are removed by being attracted to the contacts. The positive charge carriers flow through zone 3 to the cathode electrode. When the thyristor is biased in the non-conducting direction, the current source 6 is connected to contact 8 and to the cathode electrode, as a result the negative charge carriers produced in the vicinity of the pn junction located between zones 1 and 2 flow off to the current source 6 via contact 8.

Consistent with the previously mentioned practice, the zones of the illustrative embodiment of FIG. 3 are designated with the same reference numerals as those in FIG. 2 to identify corresponding zones. The anode-side emitter zone 2 and the cathode-side base zone 3 are, in this case, each embedded flat in one of the surfaces of the semiconductor body. The cathode-side emitter zone 4 in turn is embedded flat in the cathode-side base zone 3. Zones 2 and 3 are provided with cutouts 19, 20, through which the central zone 1 extends to the cathode-side as well as the anode-side surface of the semiconductor body. In the cutouts 19 and 20 there are contact regions 9, 15, which have the same conductivity type as the central zone 1 but are doped at a higher concentration. The contact regions 9, 15 are contacted with the contacts 8 and 7, respectively, which in the illustrative embodiment are electrically connected to the positive pole of a current source with the conductivity type sequence npnp shown in the drawing.

The cathode-side emitter zone 4 is contacted with a cathode electrode 10, while the cathode-side base zone 3 is contacted with firing electrodes 11. The anode-side emitter zone 2 carries an anode electrode 14.

When the thyristor is biased in breakover direction, the space charge region (hatched) expands, starting from the pn junction between zones 1 and 3, toward the anode side. In this case, the contact region 15 is connected via contact 7 to the positive terminal of a current source. Electrons produced in the space charge region then flow off by being attracted to the contact region 15 parallel to the pn junction between zones 1 and 2. These electrons thus cannot produce any emission of positive charge carriers from the emitter zone 2, so that no control current is available to the transistor portion formed by the zones 3, 1 and 2. The space charge region can therefore be extended to the vicinity of the pn junction between zones 1 and 2 without danger of punch-through. This expansion of the space charge zone is represented by the location of dashed line 18.

As the charge carriers flow off parallel to the pn junction between zones 1 and 2, a voltage drop occurs there. This voltage drop, having the effect of a voltage at the pn junction, must in practice not be allowed to exceed 0.5 V if emission from the anode-side emitter 2 is to be prevented. The same situation applies for the case of biasing the thyristor in non-conducting direction wherein a similar voltage drop occurs at the pn junction between zones 1 and 3. The lateral dimensions of zones 2 and 3 are therefore selected so that the critical voltage of 0.5 V is not exceeded when the highest permissible off-state current occurs.

The cutouts 19, 20 produce curvatures in the formation of the space charge region which is designated 17 in FIG. 3. These curvatures result in decreasing the off-state voltage and must therefore be kept as small as possible. This are achieved by making the lateral dimensions of the cutouts 19, 20 small in relation to the thickness of the central zone 1. It is advisable furthermore not to allow the contact regions 9, 15 to directly abut the pn junctions between zones 1 and 2 or 1 and 3, respectively. Thus a portion of the lighter doped central zone 1 inside the cutouts 19, 20 extends to the surface of the semiconductor body, and the blocking effect of the lighter doped zone 1 is preserved also at the surface.

Zones 2 and 3 may be embedded in the surface of the semiconductor body as individual islands separated from each other, as is illustrated for the zones 3 in FIG. 4. The cutouts 19, 20 then extend to the planar surface of the semiconductor body to form a continuous reticular pattern between the islands. Cutouts 20 are not designated in FIG. 4 since they extend to the reverse side. The contact regions 9, 15 may form a coherent net or, as illustrated in FIG. 4, form strip-shaped islands between pairs of islands. To minimize the influence of the space charge region curvature at the intersections on the blocking ability, also the cutouts 19 and 20 may be formed as separate strips. Then zone 3 constitutes a coherent zone. For the sake of greater clarity, all electrodes have been omitted in FIG. 4. Instead of the square islands 3 shown, the zones 2, 3 may be strips.

In FIG. 5, the case is illustrated that zone 3 forms a single coherent zone, within which the cutouts 19 extend to the surface of the semiconductor body. Here the contact regions 9 form islands inside the cutouts 19. A corresponding configuration may be selected for the anode-side emitter zone 2.

If an island structure is selected for the geometrical design of zones 2 and 3, also the cathode electrode 10 is divided into individual islands. These partial electrodes are then joined together by appropriate wiring or a metallization. The equivalent situation applies to the control electrode 11, the electrodes 7 and 8, and the anode electrode 14.

In typical illustrative embodiments for a voltage of 0 V (and +10 V) at the contact regions the following lateral dimensions are appropriate:

Zones 2, 3 = 0.7 (5.0) mm, zone 4 = 0.5 (4.5) mm, electrodes 10, 14 = 0.4 (4.3) mm, contact regions 9, 15 = 70 $\mu$m, cutouts 19, 20 = 100 $\mu$m.

In FIG. 6, an illustrative embodiment is depicted with respect to that shown in FIG. 3. It differs from that according to FIG. 3 primarily in that the contacts 7, 8 and the contact regions 9, 15 are arranged in depressions or recesses 21, 22. This results in a simpler contacting arrangement in particular on the anode side, as here a continuous flat feed electrode can be used. On the cathode side a simplified contact electrode may be used, as here only the cathode electrode 10 and the gate electrode 11 are at the same level. Concerning the lateral dimensions and distances, equivalent conditions apply as for the embodiment according to FIG. 3.

In FIG. 7, a particular thyristor, referred to as a electro-static induction thyristor (SIT), is illustrated in the form of a vertical junction field effect thyristor. It has on the cathode-side surface of the semiconductor body, emitter zones 4 and recessed gate regions 16 of the opposite conductivity type to that of the central zone 1. The arrangement on the other side of the semiconductor body, the anode side, may then conform to that of the illustrative embodiment of FIG. 3, but may be designed in the same manner as the cathode side. If a negative voltage is applied at the gate electrode G, a space charge region builds up, starting from the zones 16, and expanding to the anode side. Thereby the emitter zone 4 is cut off and the thyristor does not conduct. With control voltage $>0$ V at gate G, it is controlled to conduct. As in the previous embodiments, the space charge region can expand very close to the pn junction between the zones 1 and 2, without fear of a punch through breakdown. The charge carriers produced in the case of non-conduction are again drawn off by the contact regions 15 and by the contact electrodes 7. The anode-side emitter zones 2 may, as described in connection with FIG. 3, be formed as islands or form a single cohering zone, in which the contact zones 15 come to the anode-side surface in island form.

In FIG. 8, the semiconductor body of a vertical metal oxide semiconductor (MOS) field effect thyristor is illustrated in accordance with the inventive principles. The vertical MOS field effect thyristor has a central zone 1, in which on the cathode side a zone 35 is embedded flat. The latter contains a gate zone 24. Zone 35 has cutouts 27. These cutouts and the gate zones are covered by an insulating layer 25. On the insulating layer 25 a gate electrode 25 is disposed; in zone 35 a zone 36 is embedded flat and serves as the source zone. Zones 35, 36 are contacted by a cathode electrode 23. The source zones 36 are overlapped by the gate electrode. The gate terminal is designated GK 1.

On the anode side of the semiconductor body, the configuration is identical. The anode-side p-zone is designated 28 and contains a gate zone 34. In zone 28 the source zone 30 is embedded flat. Zone 28 has cutouts 29, in which the central zone extends to the surface of the semiconductor body. In this case, the central zone 1 is covered with an oxide layer 32 which supports a gate electrode 33. Its gate terminal is designated GK 2. Gate electrode 33 overlaps the gate zones 34, to create channels between the central zone 1 and the source zones 36.

When the cathode electrode K is biased negatively, there develops, starting from the pn junction between the zones 1, 35, a space charge region, the limit of which is shown dashed in zone 1. If a positive potential is applied at gate contact GK 2, there develops in the gate zone 34 an n-conducting channel through which the negative charge carriers produced in the space charge region flow off to the anode contact 31 without producing an emission of charge carriers from the anode-side p-zone 28. The equivalent applies for load of the thyristor in the other direction, when the anode is biased negatively. Then the gate contact GK 1 is connected to the positive potential and the charge carriers flow off through the n-conducting channel in gate zone 24 to the cathode contact 23.

For the lateral dimensions and the distances of the zones in FIG. 8, the equivalent dimensions are appropriate as the illustrative embodiment according to FIG. 3 for the voltage 0 V.

For the illustrative embodiments of FIGS. 3, 6 and 8, at least one separate current source is necessary, which, depending on the direction of the blocking load, must be connected to the respective contact regions.

A simpler illustrative embodiment, which manages without a separate current source, is depicted by FIG. 9. This illustrative embodiment differs from that of FIG. 3 primarily by utilization of Schottky contacts for the contacting of the contact regions. The cathode-side Schottky contacts are designated 37 and cover the central zone 1 at the point coincident with the cathode-side base zone 3 in the cutouts 19 extending to the surface of the semiconductor body. The anode-side Schottky contacts are designated 39 and cover the central zone 1 at the point which extends beyond where the inside cutouts 20 extend to the anode-side surface of the semiconductor body. The Schottky contacts comprise a metal alloy which forms with n-doped silicon a Schottky contact. A suitable metal alloy is platinum silicide. The Schottky contacts 37, 39 overlap the cathode-side base zone 3 or respectively the anode-side emitter zone 2 somewhat, in order to securely cover the area of the cutouts 19, 20 against the metallization 38. An overlap of the p zones is not detrimental, as this metal alloy does not form a Schottky contact with p-doped silicon. The Schottky contacts themselves further are contacted by contacts 38, 39 comprising, for example, aluminum.

For the lateral dimensions of the zones and the lateral dimensions of the cutouts 19, 20, the equivalent situation as for the illustrative embodiment according to FIG. 3 applies for the voltage 0 V condition.

When the thyristor is biased with an off-state voltage in breakover direction, the space charge region illustrated in FIG. 9 develops. It can expand approximately to the broken line 18, as negative charge carriers produced in the space charge region are conducted to the anode A via the Schottky contact 39. Upon load in off-state direction, the space charge region builds up starting from the pn junction between zones 1 and 2 in the direction of the cathode. Negative carriers produced in off-state will now be drawn off via the Schottky contacts 37 and the contacts 38 into zone 3, where they can flow off to the cathode K due to the shunt formed by electrode 10, between the zones 3 and 4. The lateral dimensions of the cathode-side emitter zone 4 should therefore be determined in a conventional manner so that the lateral voltage drop which the off-state current causes does not lead to an emission of negative charge carriers from the emitter zone 4.

The zones 2, 3 may, as already described in connection with FIG. 3, be formed as islands between which the cutouts 19, 20 extend to the surface of the semiconductor body as a coherent structure. The Schottky contacts 38, 39 may be arranged on the cutouts 19, 20 as a coherent or continuous net or as islands in the form of strips for example. But here, too, the Schottky contacts should fill the cutouts 19, 20 well, by at least partly overlapping the zones 2, 3. Alternatively the zones 2, 3 may be formed cohering as a single zone, while the Schottky contacts 37, 39 are arranged as islands on the cutouts 19, 20.

For all of the illustrative embodiments, it is advisable to arrange the contact regions not to be opposite to those regions from which the thyristor is turned on. Preferably, therefore, these regions are arranged in staggered or alternating fashion.

There has thus been shown and described novel thyristor structures and arrangements which fulfills all the objects and advantages sought therefor. Many other changes, modifications, variations and other uses and applications of the subject invention will, however, become apparent to those skilled in the art after considering this specification and the accompanying drawing which disclose the preferred embodiment thereof. All such changes, modifications, variations and other uses and applications which do not depart from the spirit and scope of the invention are deemed to be covered by the invention which is limited only by the claims which follow.

I claim:

1. A thyristor comprising: a semiconductor body having an anode side surface and a cathode side main surface and including a central zone of a first conductivity type and given doping level, at least one cathode-side emitter zone of said first conductivity type being embedded in the cathode-side base zone and at least one cathode-side base zone and at least one anode-side emitter zone both of a second conductivity type, as well as at least one cathode electrode and one anode electrode, one of the surfaces having the anode-side emitter zone and the other of the surfaces having the cathode-side base zone, portions of the central zone extending to the cathode-side surface and to the anode-side surface of the semiconductor body, further comprising contact regions disposed on the anode-side surface and on the cathode-side surface within said portions of the central zone and having the first conductivity type but a higher doping concentration than the central zone, the contact regions being electrically insulated from the cathode and anode electrodes respectively and being provided with contacts, the contacts being connectable with a potential source which has a positive polarity, wherein the cathode-side contact regions are opposite an anode-side emitter zone, and the anode-side contact regions are opposite a cathode-side base zone.

2. A thyristor according to claim 1, further comprising a plurality of portions of the central zone extending to their respective surfaces to form a coherent net on each of the two surfaces, the anode-side emitter zone and the cathode-side base zone are embedded in the form of a plurality of islands separated from one another in the central zone, and the contact regions between the islands are likewise embedded in the central zone.

3. A thyristor according to claim 2, wherein the contacts and the contact regions are in the form of strips.

4. A thyristor according to claim 1, wherein the contact regions form islands and are embedded in the central zone inside the portions.

5. A thyristor according to claim 1, wherein the central zone extends to the surface of the semiconductor body between the contact regions and the anode-side emitter zone or respectively the cathode-side base zone.

6. A thyristor according to claim 2, wherein the central zone extends to the surface of the semiconductor body between the contact regions and the anode-side emitter zone or respectively the cathode-side base zone.

7. A thyristor according to claim 3, wherein the central zone extends to the surface of the semiconductor body between the contact regions and the anode-side emitter zone or respectively the cathode-side base zone.

8. A thyristor according to claim 4, wherein the central zone extends to the surface of the semiconductor body between the contact regions and the anode-side emitter zone or respectively the cathode-side base zone.

9. A thyristor comprising: a semiconductor body having two major surfaces and a central zone of a first conductivity type and a given doping level, at least one cathode-side base zone and at least one anode-side emitter zone both of a second conductivity type but disposed on different ones of two major surfaces, at least one cathode electrode and at least one anode electrode, portions of the central zone extending to the cathode side surface and to the anode side surface of the semiconductor body; Schottky contacts are disposed in the central zone inside the portions; the Schottky contacts on the cathode side are provided with electrodes which contact the cathode-side base zone and are connected to the gate lead on the cathode side; and the Schottky contacts on the anode side are contacted by the anode electrode.

10. A thyristor according to claim 9, wherein the portions and the Schottky contacts form a coherent net, the anode-side emitter zone and the cathode-side base zone are embedded as islands in the central zone, and the Schottky contacts are arranged between the islands on the surface of the central zone.

11. A thyristor according to claim 9, wherein the Schottky contacts overlap the cathode-side base zone and the anode-side emitter zone.

12. A thyristor according to claim 10, wherein the islands and the Schottky contacts are in the form of strips.

13. A thyristor according to claim 10, wherein the portions of the central zone and the Schottky contacts are arranged as islands on the surface of the cutouts.

14. A thyristor according to claim 11, wherein the portions of the central zone and the Schottky contacts are arranged as islands on the surface of the cutouts.

* * * * *